United States Patent
Masuda (10) Patent No.: US 10,930,736 B2
(45) Date of Patent: Feb. 23, 2021

(54) SEMICONDUCTOR APPARATUS

(71) Applicant: Mitsubishi Electric Corporation, Tokyo (JP)

(72) Inventor: Koichi Masuda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/135,014

(22) Filed: Sep. 19, 2018

(65) Prior Publication Data
US 2019/0259837 A1     Aug. 22, 2019

(30) Foreign Application Priority Data
Feb. 20, 2018  (JP) .............................. JP2018-027780

(51) Int. Cl.
*H01L 29/06*     (2006.01)
*H01L 29/739*    (2006.01)
(Continued)

(52) U.S. Cl.
CPC ............ *H01L 29/0696* (2013.01); *G01K 7/16* (2013.01); *H01L 23/04* (2013.01); *H01L 23/34* (2013.01);
(Continued)

(58) Field of Classification Search
CPC .. H01L 29/0696; H01L 29/7393; H01L 23/34
See application file for complete search history.

(56) References Cited

U.S. PATENT DOCUMENTS

| | | | |
|---|---|---|---|
| 7,706,756 B2* | 4/2010 | Sato | ......................... H03F 3/195 |
| | | | 333/100 |
| 2006/0091560 A1* | 5/2006 | Kang | .................. H01L 25/0652 |
| | | | 257/777 |

(Continued)

FOREIGN PATENT DOCUMENTS

| DE | 112013007361 T5 | 5/2016 |
|---|---|---|
| JP | 2002-076236 A | 3/2002 |
| JP | 2011-086821 A | 4/2011 |

OTHER PUBLICATIONS

An Office Action mailed by the German Patent and Trademark Office dated Apr. 15, 2019, which corresponds to German Patent Application No. 101018220949.9 and is related to U.S. Appl. No. 16/135,014.

*Primary Examiner* — Trang Q Tran
(74) *Attorney, Agent, or Firm* — Studebaker & Brackett PC (57) ABSTRACT

A semiconductor apparatus includes: an insulating substrate including an insulating layer having first and second main surfaces, a metal plate on the first main surface, and first to fourth conductors on the second main surface; a semiconductor device including a rear electrode electrically connected to the first conductor and a front electrode electrically connected to the second conductor; a temperature detection device including a first electrode electrically connected to the third conductor and a second electrode electrically connected to the fourth conductor; a first terminal electrically connected to the third conductor; a second terminal positioned so as to be wire-connectable to the fourth conductor; and a third terminal electrically connected to the second conductor, wherein the fourth conductor is positioned so as to be wire-connectable to the second conductor.

6 Claims, 12 Drawing Sheets

(51) Int. Cl.
*H01L 23/34* (2006.01)
*G01K 7/16* (2006.01)
*H01L 23/64* (2006.01)
*H01L 23/04* (2006.01)
*H01L 23/373* (2006.01)

(52) U.S. Cl.
CPC ........ *H01L 23/3735* (2013.01); *H01L 23/645* (2013.01); *H01L 29/7393* (2013.01); *H01L 2924/13055* (2013.01)

(56) References Cited

U.S. PATENT DOCUMENTS

| | | | |
|---|---|---|---|
| 2007/0086708 A1* | 4/2007 | Nojima | H01L 31/167 385/88 |
| 2010/0078675 A1* | 4/2010 | Kudo | H01L 23/24 257/140 |
| 2016/0141284 A1 | 5/2016 | Ishihara et al. | |
| 2018/0005988 A1* | 1/2018 | Deligianni | H01L 27/092 |

* cited by examiner

SEMICONDUCTOR APPARATUS

BACKGROUND OF THE INVENTION

Field

The present invention relates to a semiconductor apparatus including a temperature detection device.

Background

For the purpose of protecting semiconductor apparatuses such as power modules used for inverters or the like from overheating, such semiconductor apparatuses are equipped with a temperature detection device inside and the temperature detection device detects temperature inside the semiconductor apparatus.

For example, a configuration in which electrodes are connected to both ends of a resistor having temperature dependency is used for such a temperature detection device. The respective electrodes are electrically connected to two terminals provided for connection with a measuring instrument outside the semiconductor apparatus. A temperature inside the semiconductor apparatus is determined from a resistance value when a current is applied to a circuit constructed of the measuring instrument and the temperature detection device (hereinafter, referred to as a "temperature detection circuit"). When the temperature reaches or exceeds a prescribed value, a control circuit outside the semiconductor apparatus stops operation or suppresses the current of the semiconductor apparatus, and thus protects the semiconductor apparatus from overheating.

A reference potential (potential of the electrode connection destination) of the temperature detection device may be used as a reference potential (emitter potential) of a drive circuit of a switching device such as an IGBT (insulated gate bipolar transistor) mounted in the semiconductor apparatus (hereinafter, referred to as an "emitter potential type") or may be used as a potential independent of the emitter potential (hereinafter, referred to as an "independent type"). Which one of the emitter potential type and the independent type is selected as the reference potential of the temperature detection device is determined depending on the design of the control circuit of the user of the semiconductor apparatus.

Figure 3:
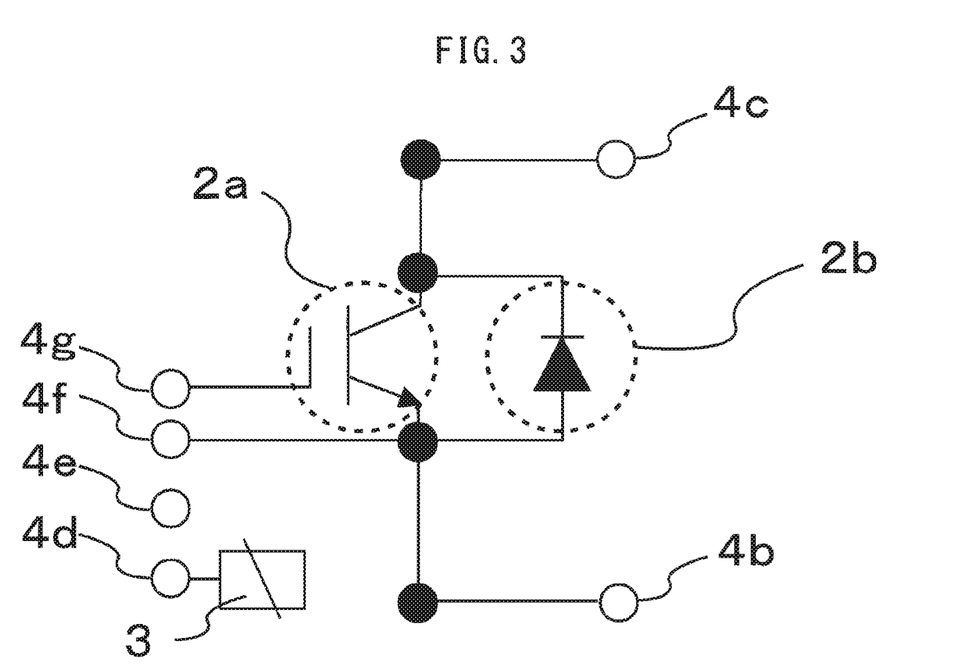
FIG. 3 is a circuit diagram of the semiconductor apparatus according to the first embodiment of the present invention.
Figure 5:
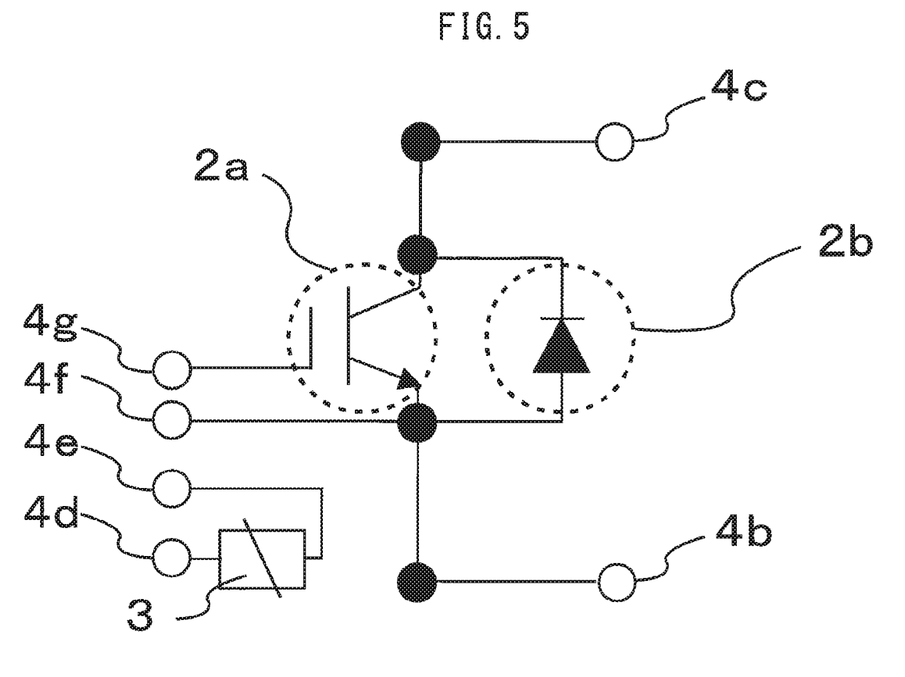
FIG. 5 is a circuit diagram of the independent type semiconductor apparatus according to the first embodiment of the present invention.

An example of the emitter potential type semiconductor apparatus is a semiconductor apparatus shown in FIG. 3 and FIG. 5 of JP 2002-076236 A. An example of the independent type semiconductor apparatus is a semiconductor apparatus described in JP 2011-086821 A.

SUMMARY

When designing a product incorporated with a semiconductor apparatus, the user of the semiconductor apparatus may configure the product so that any one of semiconductor apparatuses of a plurality of semiconductor manufacturers can be used. In the above-described case, designs of control circuits are preferably standardized for the respective products. For that reason, the respective semiconductor apparatuses need to be unified into either an independent type semiconductor apparatus or an emitter potential type semiconductor apparatus. Therefore, each semiconductor apparatus needs to be changed from an independent type semiconductor apparatus to an emitter potential type or vice versa.

However, wirings are formed at high density inside the conventional semiconductor apparatuses to meet the demand for miniaturization or a size reduction of semiconductor devices. Thus, when the aforementioned temperature detection circuit type is changed, it may be unavoidable to take measures for changing not only wiring of the temperature detection circuit but also a wiring layout involving a main circuit (inverter circuit section). A change of the wiring layout of the main circuit may cause a change of an inductance of the main circuit and cause fluctuation in electric characteristics such as deterioration of shunt balancing inside the semiconductor apparatus or promoting heat generation of some semiconductor devices. For the above-described reasons, it is difficult for the conventional semiconductor apparatuses to change the design concerning a temperature detection circuit without accompanying any fluctuation in electric characteristics, leaving a possibility that the demands from the user side may not be met.

The present invention has been implemented to solve the above-described problems and it is an object of the present invention to provide a semiconductor apparatus capable of changing a temperature detection circuit while suppressing fluctuation in electric characteristics in adaptation to any one of an emitter potential type semiconductor apparatus and an independent type semiconductor apparatus.

A semiconductor apparatus according to the present invention includes: an insulating substrate including an insulating layer having first and second main surfaces, a metal plate on the first main surface, and first to fourth conductors on the second main surface; a semiconductor device including a rear electrode electrically connected to the first conductor and a front electrode electrically connected to the second conductor, a temperature detection device including a first electrode electrically connected to the third conductor and a second electrode electrically connected to the fourth conductor; a first terminal electrically connected to the third conductor, a second terminal positioned so as to be wire-connectable to the fourth conductor, and a third terminal electrically connected to the second conductor, wherein the fourth conductor is positioned so as to be wire-connectable to the second conductor.

The present invention makes it possible to provide a semiconductor apparatus capable of changing a temperature detection circuit while suppressing fluctuation in electric characteristics in adaptation to any one of an emitter potential type semiconductor apparatus and an independent type semiconductor apparatus.

Other and further objects, features and advantages of the invention will appear more fully from the following description.

DESCRIPTION OF EMBODIMENTS

First Embodiment

Figure 1:
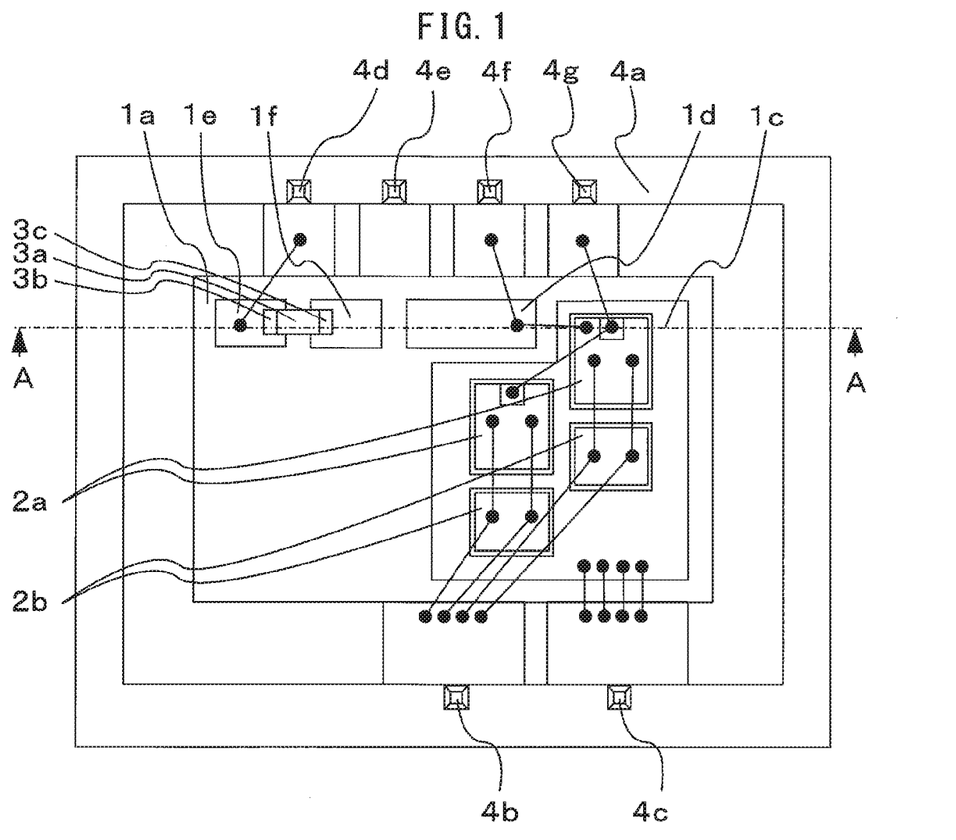
FIG. 1 is a configuration diagram of the semiconductor apparatus according to the first embodiment of the present invention.
Figure 2:
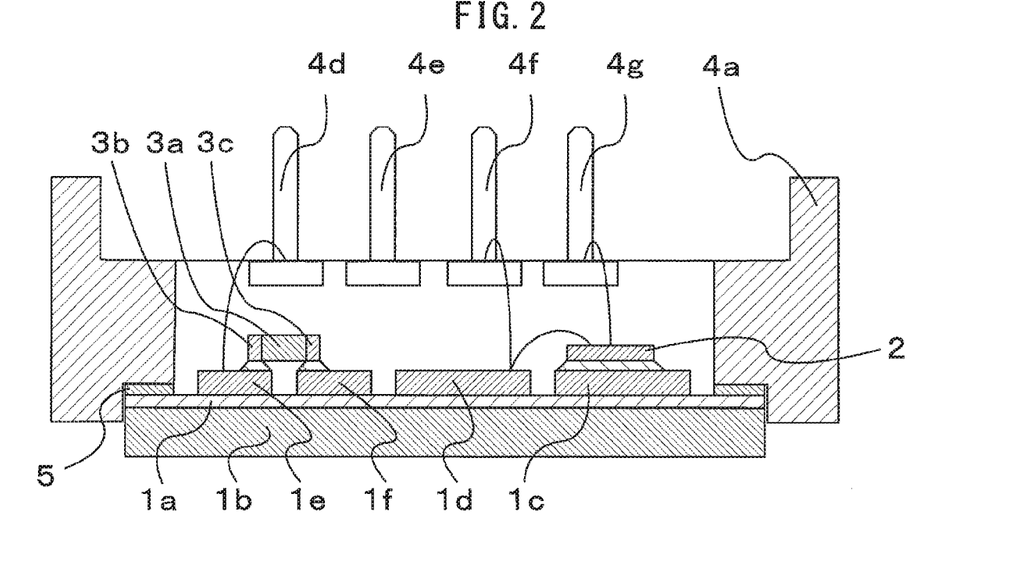
FIG. 2 is a cross-sectional view of the semiconductor apparatus according to the first embodiment of the present invention.

A configuration of a semiconductor apparatus 100 according to a first embodiment of the present invention will be described. FIG. 1 is a configuration diagram of the semiconductor apparatus 100 according to the first embodiment of the present invention. FIG. 2 is a cross-sectional view along a line A-A shown in FIG. 1. FIG. 3 is a circuit diagram of the semiconductor apparatus 100.

The configuration of the semiconductor apparatus 100 will be described using FIG. 2. An insulating substrate 1 insulates the inside of the semiconductor apparatus from the outside of the semiconductor apparatus. The insulating substrate 1 includes an insulating layer 1a, includes a metal plate 1b on one main surface of the insulating layer 1a, and includes a first conductor 1c, a second conductor 1d, a third conductor 1e and a fourth conductor 1f on the other main surface of the insulating layer 1a.

A semiconductor device 2 made of silicon is mounted on the first conductor 1c via solder. Here, the semiconductor device 2 refers to a combination of a switching device 2a and a rectification device 2b, and may also be made up, for example, of the rectification device 2b alone.

As shown in FIG. 1, in the semiconductor apparatus 100, the switching device 2a is made up of an IGBT and the rectification device 2b is made up of a Di. However, the semiconductor device 2 may also be made up of other devices, for example, a configuration using a MOSFET as the switching device 2a or a configuration using a device called "RC (reverse conducting)-IGBT" having features of both the switching device 2a and the rectification device 2b.

Returning back to FIG. 2, the configuration of the semiconductor apparatus 100 will be described. A temperature detection device 3 includes one electrode 3b and the other electrode 3c positioned so as to sandwich a resistance part 3a. The one electrode 3b is connected to the third conductor 1e via solder. The other electrode 3c is connected to the fourth conductor 1f via solder.

A side face of the semiconductor apparatus 100 is made of case resin 4a of a case 4. The case resin 4a is fixed to the insulating substrate 1 using a bonding member 5.

Hereinafter, the configuration of the semiconductor apparatus 100 will be described using FIG. 1. The case 4 includes an N terminal 4b and a P terminal 4c which are generally called "main terminals" and a first terminal 4d, a second terminal 4e, a third terminal 4f and a fourth terminal 4g which are generally called "main terminals and signal terminals" as terminals for connection with the outside of the semiconductor apparatus. Each terminal includes a terminal part projecting from the case resin 4a for electric connection with the outside of the semiconductor apparatus and a wire-bonding part for wiring inside the semiconductor apparatus. The terminal part and the wire-bonding part are integrated into an L shape.

The configuration of the main circuit of the semiconductor apparatus 100 will be described. In the semiconductor apparatus 100, the semiconductor device 2 is constructed of two IGBTs which are the switching devices 2a and two Dis which are the rectification devices 2b. A surface electrode (emitter electrode) of the switching device 2a, a surface electrode (anode electrode) of the rectification device 2b and the N terminal 4b are connected together via wires. Furthermore, the first conductor 1c and the P terminal 4c are connected together via a wire. With the above-described wiring, a main circuit of the semiconductor apparatus 100 is constructed in which the N terminal 4b and the P terminal 4c are used as input/output terminals, conduction thereof is controlled by the semiconductor device 2, and the first conductor 1c and the wire jointly form a current path.

The circuit configuration associated with signal transmission that controls conduction of the main circuit will be described using FIG. 1. The third terminal 4f is connected to an emitter electrode of the switching device 2a via the second conductor 1d. The fourth terminal 4g is connected to a gate electrode of the switching device 2a. That is, the third terminal 4f corresponds to a terminal called an "emitter signal terminal" and the fourth terminal 4g corresponds to a terminal called a "gate signal terminal." With the above-described wiring, the second conductor 1d has an emitter potential. The semiconductor apparatus according to the present embodiment has a configuration generally called an "IGBT" module. Here, the fourth terminal 4g is unnecessary for a semiconductor apparatus constructed of only the rectification device 2b, for example, a semiconductor apparatus called a "Di module."

Next, the configuration concerning the temperature detection circuit will be described. The third conductor 1e on which the one electrode 3b of the temperature detection device 3 is mounted is connected to the first terminal 4d via a wire. The fourth conductor if on which the other electrode 3c of the temperature detection device 3 is mounted is not electrically connected to other conductors or terminals except the temperature detection device 3. The second terminal 4e is not electrically connected to other conductors or terminals, either.

The fourth conductor if is positioned so that the wire connection destination thereof may be changeable according to two types of demands on the user side of the emitter potential type semiconductor apparatus and the independent type semiconductor apparatus. More specifically, the fourth conductor 1f is positioned at a distance where the fourth conductor 1f can be wire-connected to both the second terminal 4e independent of the main circuit and the second conductor 1d having the emitter potential. The "wire-connectable distance" in the present invention more specifically refers to a spatial distance of 30 mm or less. The reason that the wire length is set to 30 mm or less is to prevent the wire from bending with the self-weight of the wire and coming into contact with parts having different potentials.

With the above-described configuration and wiring, the electric circuit of the semiconductor apparatus 100 constitutes a circuit shown in FIG. 3.

By adopting the configuration, wiring and arrangement of the semiconductor apparatus 100, it is possible to provide a product with the same electric characteristics in response to demands of both the emitter potential type semiconductor apparatus and the independent type semiconductor apparatus.

Figure 4:
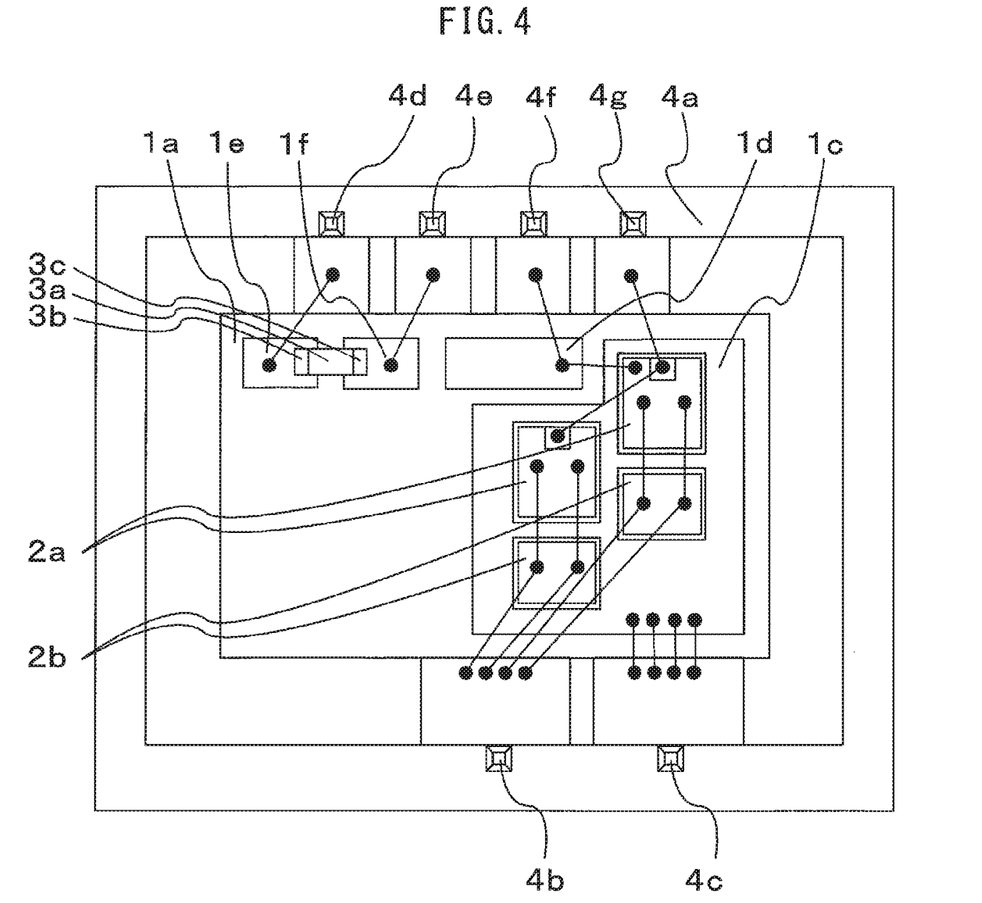
FIG. 4 is a configuration diagram of the independent type semiconductor apparatus according to the first embodiment of the present invention.

When a demand for the independent type semiconductor apparatus is received from the user side, the demand can be responded by a semiconductor apparatus 110 shown in FIG. 4. Here, the semiconductor apparatus 110 is an independent type semiconductor apparatus configured using the semiconductor apparatus 100. The electric circuit of the semiconductor apparatus 110 is a circuit shown in FIG. 5.

The semiconductor apparatus 110 has a configuration in which the fourth conductor 1f and the second terminal 4e of the semiconductor apparatus 100 are wire-connected together and the interior of the case 4 is sealed with an insulating member (not shown).

A temperature detection circuit of the semiconductor apparatus 110 is constructed of the first terminal 4d and the second terminal 4e as the input/output terminals and a current path between the temperature detection device 3 and the input/output terminals (third conductor 1e, fourth conductor 1f and wire) and is a circuit independent of the main circuit.

Figure 6:
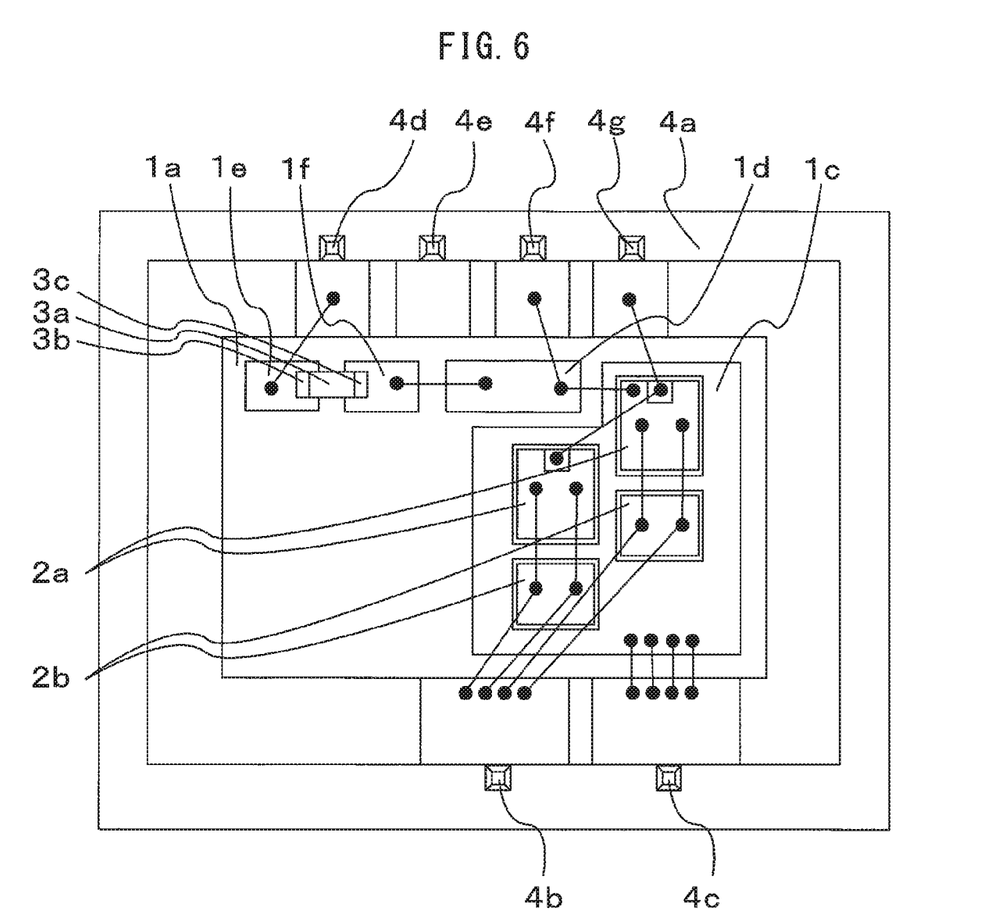
FIG. 6 is a configuration diagram of the emitter potential type semiconductor apparatus according to the first embodiment of the present invention.

When a demand for the emitter potential type semiconductor apparatus is received from the user side, the demand can be responded by a semiconductor apparatus 120 shown in FIG. 6. Here, the semiconductor apparatus 120 is an emitter potential type semiconductor apparatus configured using the semiconductor apparatus 100. An electric circuit of the semiconductor apparatus 120 is a circuit shown in FIG. 7.

The semiconductor apparatus 120 has a configuration in which the fourth conductor 1f and the second conductor 1d of the semiconductor apparatus 100 are wire-connected together and the inside of the case 4 is sealed with an insulating member (not shown). Note that the second terminal 4e of the semiconductor apparatus 120 is not electrically connected to other conductors and terminals.

Figure 7:
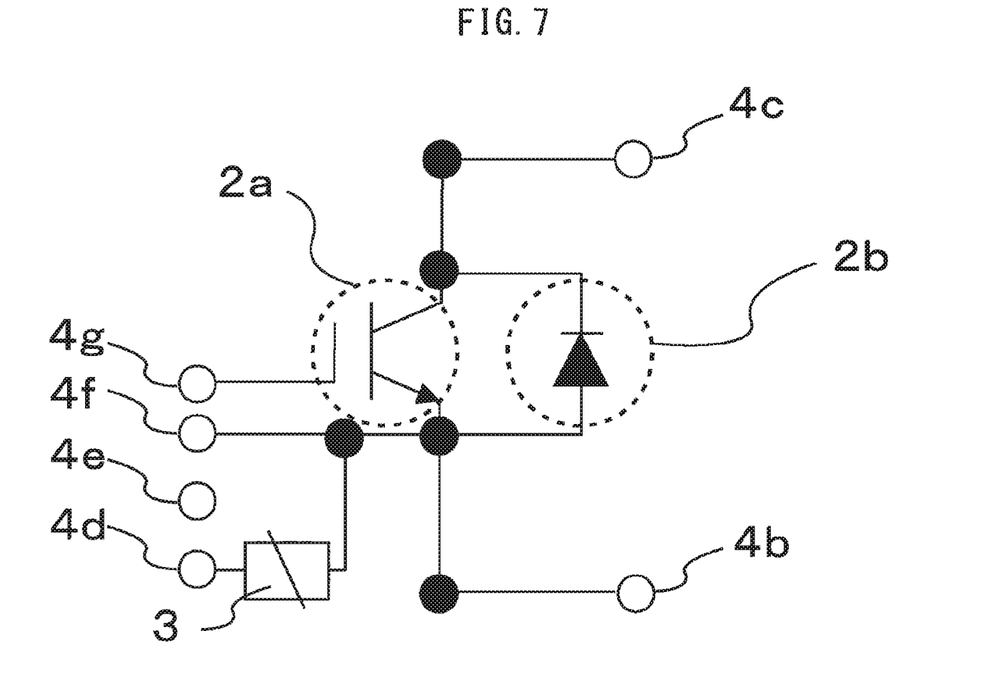
FIG. 7 is a circuit diagram of the emitter potential type semiconductor apparatus according to the first embodiment of the present invention.

A temperature detection circuit of the semiconductor apparatus 120 is constructed of the first terminal 4d and the third terminal 4f as input/output terminals, and a current path between the temperature detection device 3 and the input/output terminals (second conductor 1d, third conductor 1e, fourth conductor 1f and wire). Since the second conductor 1d has an emitter potential, the third terminal 4f which is an input/output terminal also has the emitter potential, and it is possible to constitute an emitter potential type semiconductor apparatus.

A design change of the temperature detection circuit will be described. When a design change from the independent type semiconductor apparatus 110 to the emitter potential type semiconductor apparatus 120 is necessary, such a change is possible by deleting the wire connecting the fourth conductor 1f and the second terminal 4e and wire-connecting the fourth conductor 1f and the second conductor 1d. On the other hand, when a design change from the semiconductor apparatus 120 to the semiconductor apparatus 110 is necessary, such a change is possible by deleting the wire connecting the fourth conductor 1f and the second conductor 1d and wire-connecting the fourth conductor 1f and the second terminal 4e. Such changes are possible because the fourth conductor 1f and the second terminal 4e are positioned so as to be wire-connectable together and the fourth conductor 1f and the second conductor 1d are positioned so as to be wire-connectable together.

The semiconductor apparatus 110 and the semiconductor apparatus 120 configured using the configuration and arrangement of the semiconductor apparatus 100 have similar arrangements of the N terminal 4b and the P terminal 4c which are the input/output terminals of the main circuit, the first conductor 1c and the wire constituting the current path of the main circuit and the semiconductor device 2 that controls conduction of the main circuit, and so have similar inductances of the main circuit and have similar electric characteristics. That is, the semiconductor apparatus 110 and the semiconductor apparatus 120 can change the temperature detection circuit while suppressing fluctuations in the electric characteristics.

By using the configuration and arrangement of the semiconductor apparatus 100 of the present invention in this way, it is possible to provide a semiconductor apparatus capable of changing the temperature detection circuit while suppressing fluctuations in the electric characteristics, whether the semiconductor apparatus is adapted to the emitter potential type semiconductor apparatus or the independent type semiconductor apparatus.

However, the semiconductor apparatus 110 and the semiconductor apparatus 120 use the first terminal 4d in common as the input/output terminal of the temperature detection circuit, but use different terminals used in combination with the first terminal 4d. While the terminal used in combination with the first terminal 4d is the second terminal 4e for the semiconductor apparatus 110, it is the third terminal 4f for the semiconductor apparatus 120.

The following will describe how the semiconductor apparatus is adapted to a case where the input/output terminals of the temperature detection circuit need to be matched for the semiconductor apparatus 110 and the semiconductor apparatus 120.

Figure 8:
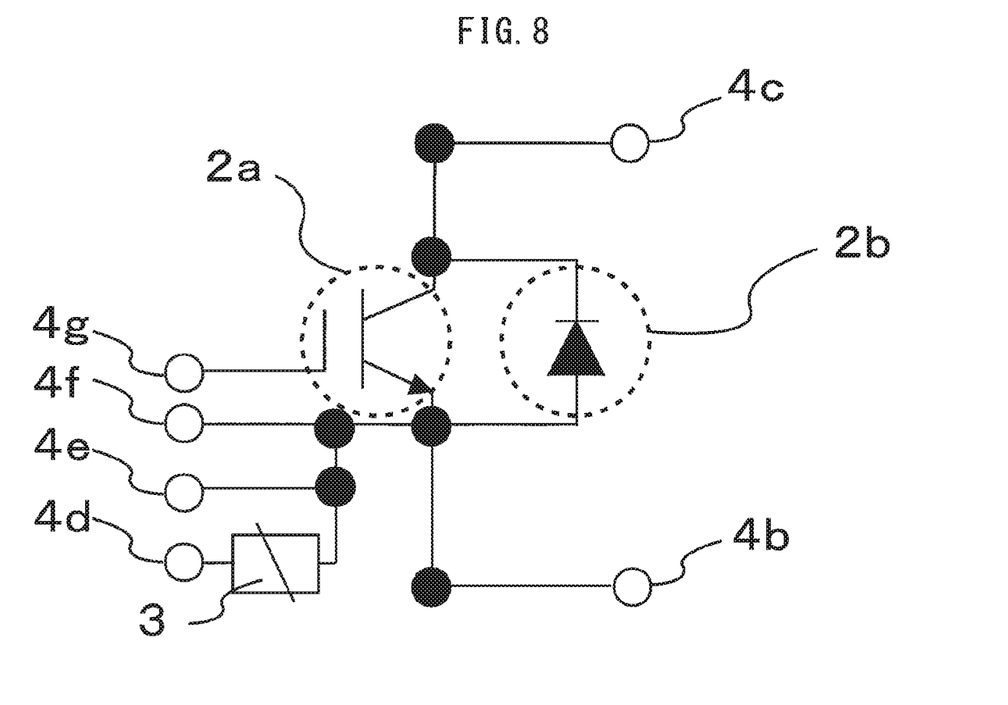
FIG. 8 is a circuit diagram of the emitter potential type semiconductor apparatus according to the first embodiment of the present invention.

Matching the input/output terminals of the temperature detection circuit is possible by effectively using the second terminal 4e of the semiconductor apparatus 120. As can be confirmed from FIG. 6 and FIG. 7, the second terminal 4e of the semiconductor apparatus 120 is not electrically connected to other conductors and terminals. An electric circuit shown in FIG. 8 can be formed by wire-connecting the second terminal 4e to any one of the second conductor 1d, the third terminal 4f and the fourth conductor 1f or a combination thereof. That is, by adding the above-described wiring, the second terminal 4e and the third terminal 4f of the semiconductor apparatus 120 can be set to the same potential and the first terminal 4d and the second terminal 4e can be used as the input/output terminals of the temperature detection circuit as in the case of the semiconductor apparatus 110.

As described above, the fourth conductor 1f is positioned at a distance where the fourth conductor 1f can be wire-connected to both the second terminal 4e and the second conductor 1d, but since the second terminal 4e and the third terminal 4f are used for wiring in the semiconductor apparatus 120, there may be a case where it is difficult to secure a space to allow wire bonding. In such a case, the second terminal 4e and the third terminal 4f are preferably positioned at a distance where they can be wire-connected.

The semiconductor device 2 of the semiconductor apparatus 100 according to the present first embodiment includes two switching devices 2a and two rectification devices 2b, but the numbers of the respective devices can be freely designed, and, for example, one switching device 2a and three rectification devices 2b can be provided.

The semiconductor apparatus 100 according to the present first embodiment is a semiconductor apparatus with wire connection called "1 in 1," but it is likewise possible to provide a semiconductor apparatus capable of meeting the demands from two user sides for semiconductor apparatuses with other wire connections. In that case, the main circuit may be configured by providing a plurality of first conductors 1c, mounting the semiconductor devices 2 on the first conductors 1c and wire-connecting them in series or in parallel. The configuration of a semiconductor apparatus corresponding to the semiconductor apparatus 100 is possible by wire-connecting the second conductor 1d to the surface electrode of an arbitrary semiconductor device 2. It is possible to construct a semiconductor apparatus capable of responding to demands from two user sides by selecting the second terminal 4e or the second conductor 1d to be wire-connected from the third conductor 1e.

For example, in the case of a semiconductor apparatus incorporated with a half-bridge circuit, it is possible to configure a semiconductor apparatus corresponding to the semiconductor apparatus 100 by mounting the semiconductor device 2 on the first conductors 1c, connecting two of them in series and connecting the second conductor 1d to the surface electrode of the semiconductor device 2. Here, whether the second conductor 1d is connected to the semiconductor device 2 on the high potential side or the semiconductor device 2 on the low potential side may be determined together with the design of the control circuit. When the emitter potential type semiconductor apparatus is configured, if a temperature detection circuit using an emitter potential on the high potential side as a reference is desired to be configured, the second conductor 1d may be connected to the surface electrode of the semiconductor device 2 on the high potential side. If a temperature detection circuit using an emitter potential on the low potential side as a reference is desired to be configured, the second conductor 1d may be connected to the surface electrode of the semiconductor device 2 on the low potential side.

Second Embodiment

Figure 9:
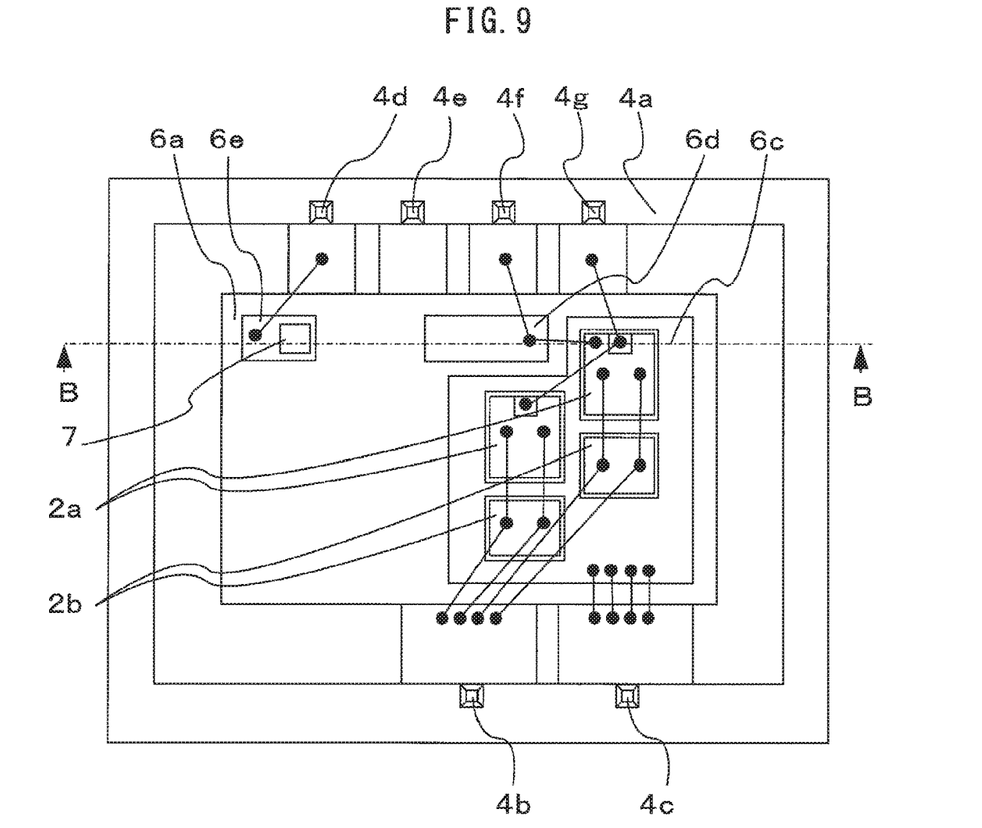
FIG. 9 is a configuration diagram of the semiconductor apparatus according to the second embodiment of the present invention.

Next, a configuration of a semiconductor apparatus 200 according to a second embodiment of the present invention will be described. In the second embodiment of the present invention, a temperature detection device is constructed of a chip-type temperature detection device 7. Note that in the second embodiment of the present invention, description of parts identical or corresponding to those in the first embodiment of the present invention is omitted.

Figure 10:
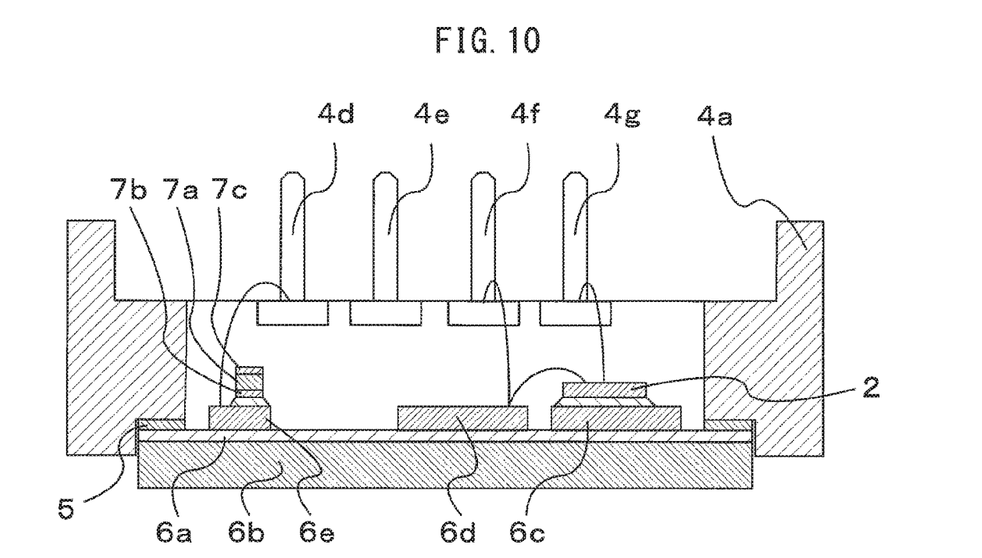
FIG. 10 is a cross-sectional view of the semiconductor apparatus according to the second embodiment of the present invention.
Figure 11:
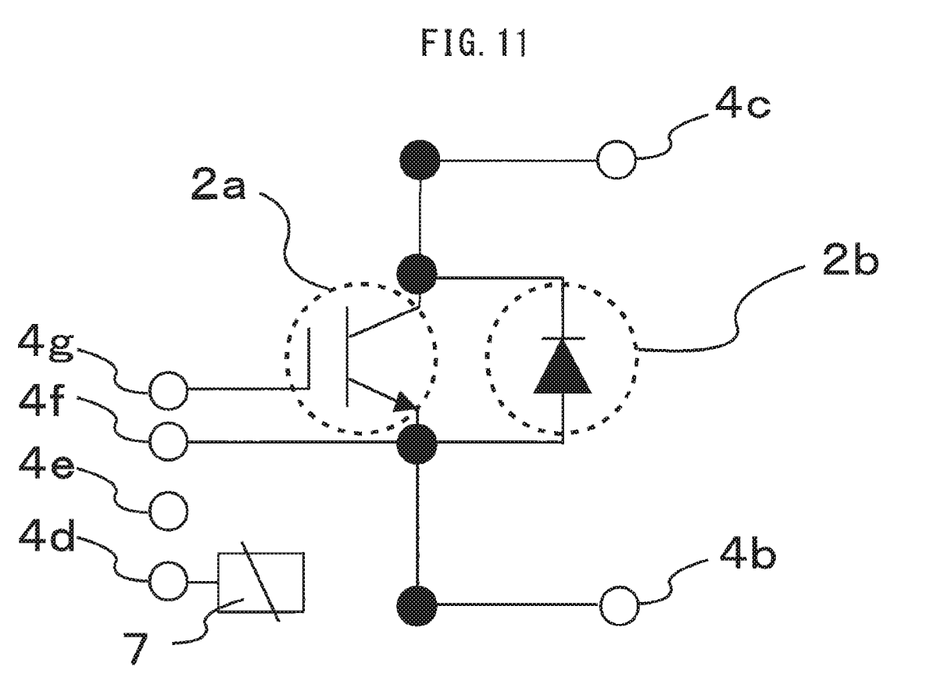
FIG. 11 is a circuit diagram of the semiconductor apparatus according to the second embodiment of the present invention.

FIG. 9 is a configuration diagram of the semiconductor apparatus 200 according to the second embodiment of the present invention and FIG. 10 is a cross-sectional view along a line B-B shown in FIG. 9. FIG. 11 is a circuit diagram of the semiconductor apparatus 100.

The configuration of the semiconductor apparatus 200 according to the present second embodiment will be described using FIG. 10. An insulating substrate 6 includes an insulating layer 6a, includes a metal plate 6b on one main surface of the insulating layer 6a and includes a first conductor 6c, a second conductor 6d and a third conductor 6e on the other main surface.

The temperature detection device 7 includes one electrode 7b and the other electrode 7c positioned so as to sandwich a resistance part 7a, the one electrode 7b of the temperature detection device 7 is connected to the third conductor 6e via solder and the other electrode 7c of the temperature detection device 7 is exposed so as to be wire-connectable.

The other electrode 7c of the temperature detection device 7 is positioned so that the wire connection destination can be changed according to demands from two user sides of an emitter potential type semiconductor apparatus and an independent type semiconductor apparatus. More specifically, the other electrode 7c of the temperature detection device 7 is positioned at a distance where the other electrode 7c can be wire-connected to both the second conductor 6d and the second terminal 4e.

The other configuration and wiring of the semiconductor apparatus 200 are configured to be similar to those of the semiconductor apparatus 100.

When a demand for an independent type semiconductor apparatus is received from the user side, the demand can be responded by a semiconductor apparatus 210 shown in FIG. 11. Here, the semiconductor apparatus 210 is an independent type semiconductor apparatus configured using the semiconductor apparatus 200 and an electric circuit of the semiconductor apparatus 210 is a circuit shown in FIG. 13.

Figure 12:
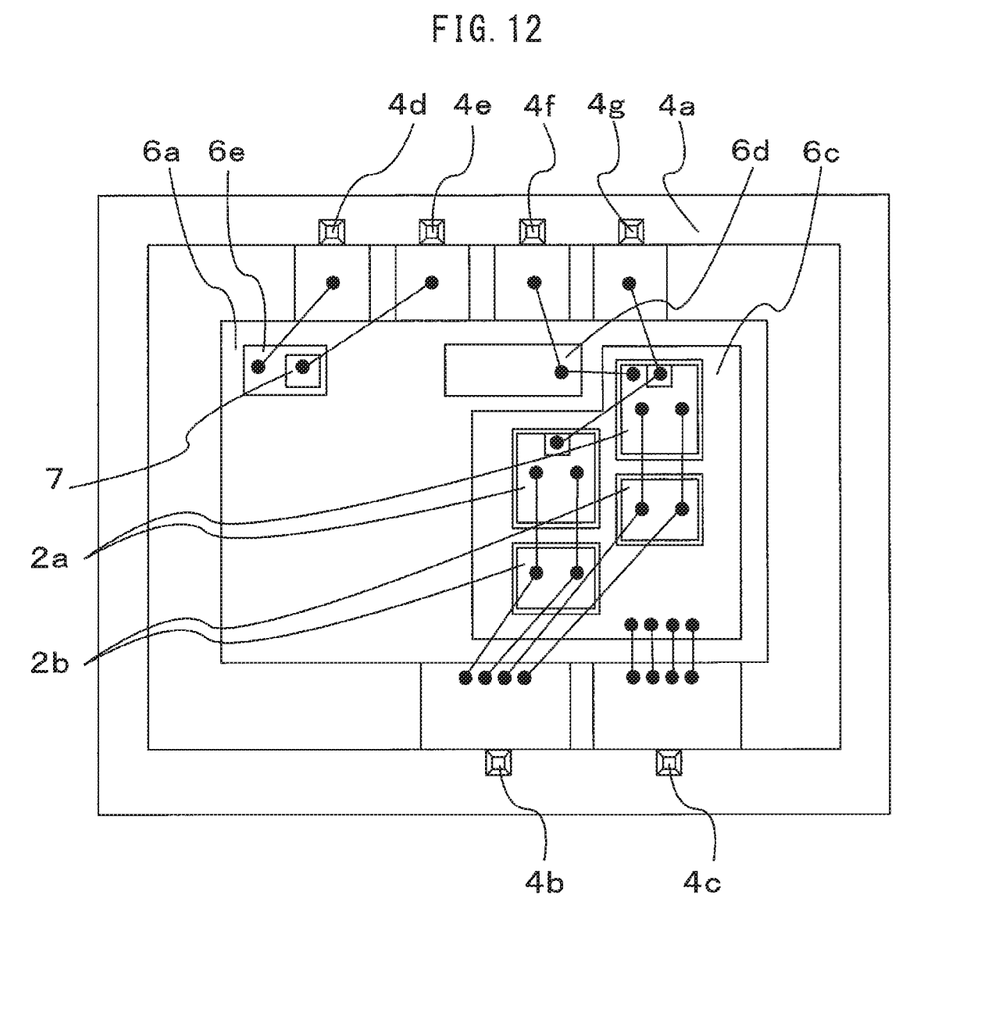
FIG. 12 is a configuration diagram of the independent type semiconductor apparatus according to the second embodiment of the present invention.

The semiconductor apparatus 210 has a configuration in which the other electrode 7c of the temperature detection device 7 and the second terminal 4e of the semiconductor apparatus 200 are wire-connected together and the inside of the case 4 is sealed with an insulating member (not shown).

Figure 13:
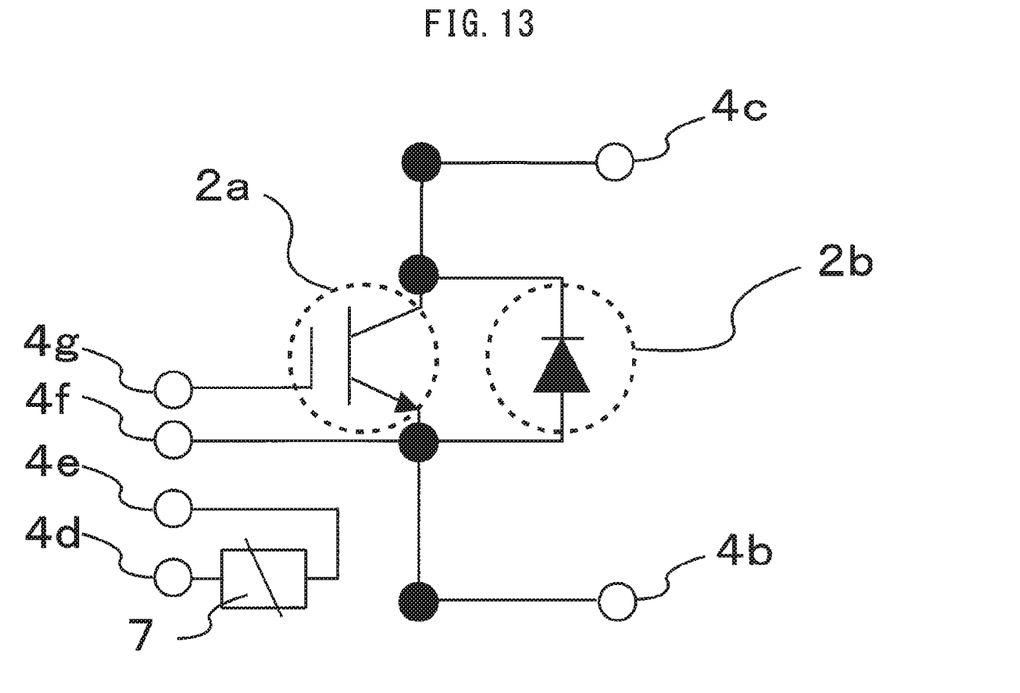
FIG. 13 is a circuit diagram of the independent type semiconductor apparatus according to the second embodiment of the present invention.

The temperature detection circuit of the semiconductor apparatus 210 is constructed of the first terminal 4d and the second terminal 4e as input/output terminals and a current path between the temperature detection device 7 and the input/output terminal (third conductor 6e, other electrode 7c of the temperature detection device 7 and wire) and is a circuit independent of the main circuit.

Figure 14:
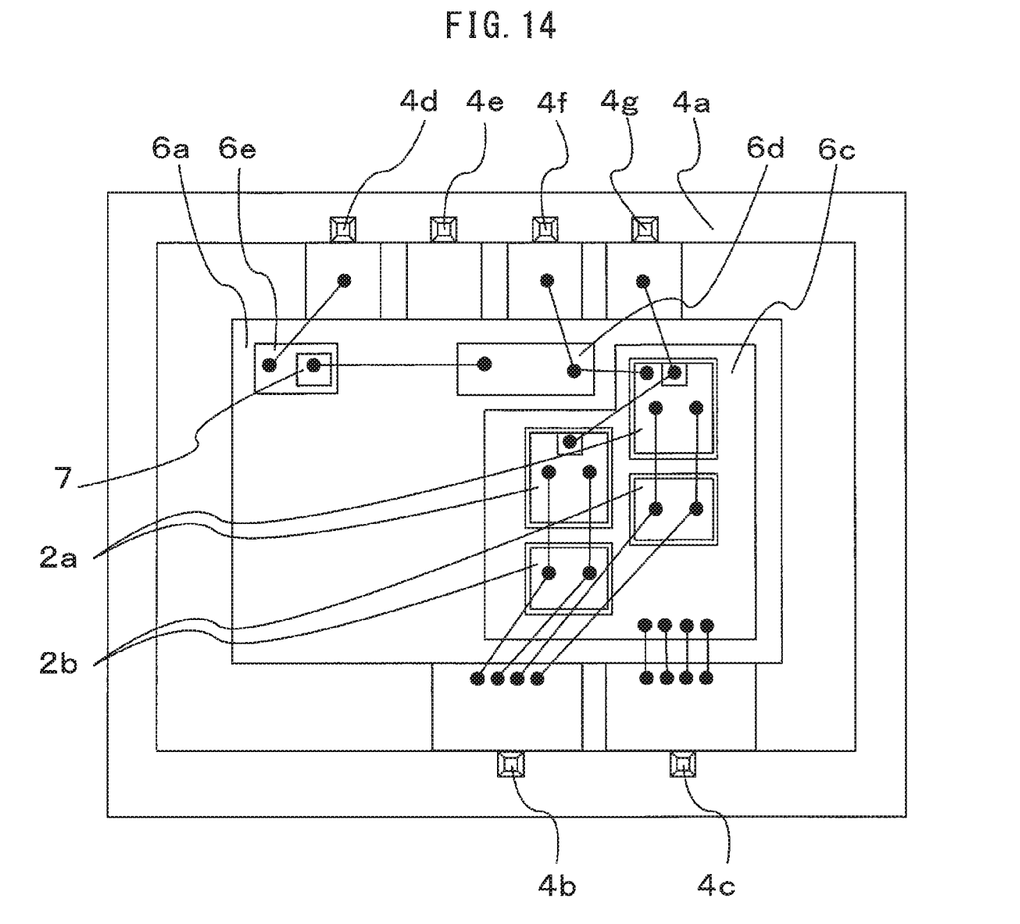
FIG. 14 is a configuration diagram of the emitter potential type semiconductor apparatus according to the second embodiment of the present invention.

When a demand for an emitter potential type semiconductor apparatus is received from the user side, the demand can be responded by a semiconductor apparatus 220 shown in FIG. 14. Here, the semiconductor apparatus 220 is an emitter potential type semiconductor apparatus using the semiconductor apparatus 200 and the electric circuit of the semiconductor apparatus 220 is a circuit shown in FIG. 15.

The semiconductor apparatus 220 has a configuration in which the other electrode 7c of the temperature detection device 7 and the second conductor 6d of the semiconductor apparatus 200 are wire-connected together and the inside of the case 4 is sealed with an insulating member (not shown). Note that the second terminal 4e of the semiconductor apparatus 220 is not electrically connected to other conductors and terminals.

Figure 15:
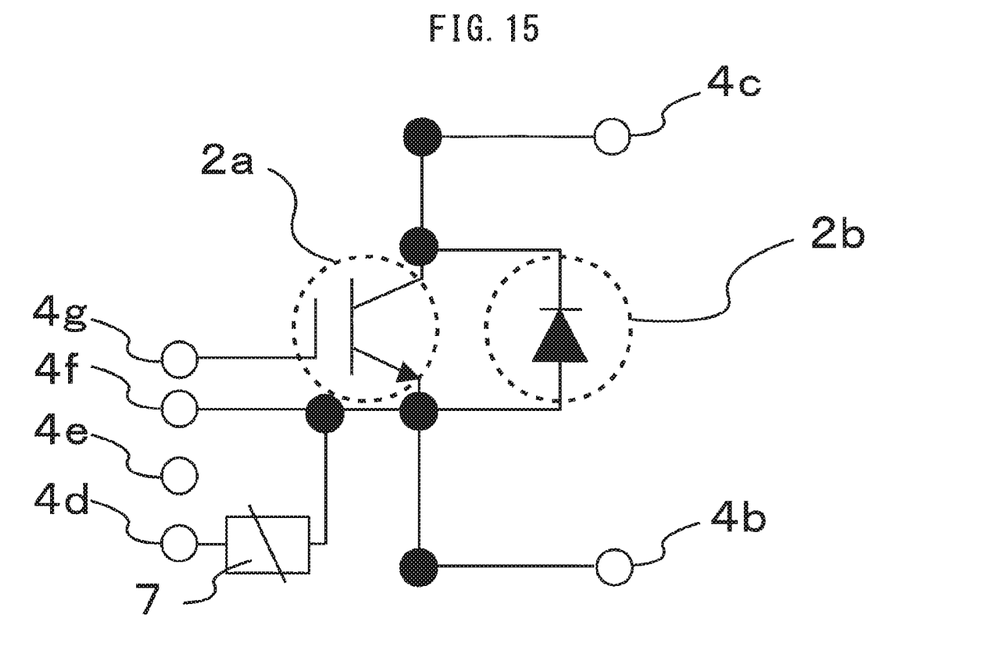
FIG. 15 is a circuit diagram of the emitter potential type semiconductor apparatus according to the second embodiment of the present invention.

The temperature detection circuit of the semiconductor apparatus 220 is constructed of the first terminal 4d and the third terminal 4f as input/output terminals and a current path between the temperature detection device 7 and the input/output terminals (second conductor 6d, third conductor 6e and wire). Since the second conductor 6d has an emitter potential, the third terminal 4f which is an input/output terminal also has an emitter potential and an emitter potential type semiconductor apparatus can be configured.

Hereinafter, a design change will be described. When a design change from the independent type semiconductor apparatus 210 to the emitter potential type semiconductor apparatus 220 is necessary, it is possible to delete the wire connecting the other electrode 7c of the temperature detection device 7 and the second terminal 4e and wire-connect the other electrode 7c of the temperature detection device 7 and the second conductor 6d. On the other hand, when a design change from the semiconductor apparatus 220 to the semiconductor apparatus 210 is necessary, it is possible to delete the wire connecting the other electrode 7c of the temperature detection device 7 and the second conductor 6d and wire-connect the other electrode 7c of the temperature detection device 7 and the second terminal 4e. These changes are possible because the other electrode 7c of the temperature detection device 7 and the second terminal 4e are positioned so as to be wire-connectable together and the other electrode 7c of the temperature detection device 7 and the second conductor 6d are positioned so as to be wire-connectable together.

The semiconductor apparatus 210 and the semiconductor apparatus 220 configured using the configuration and arrangement of the semiconductor apparatus 200 have similar arrangements of the N terminal 4b and the P terminal 4c which are input/output terminals of the main circuit, the first conductor 6c and the wire constituting a current path of the main circuit and the semiconductor device 2 that controls conduction of the main circuit, and so have similar inductances of the main circuit, and thereby have similar electric characteristics. That is, the semiconductor apparatus 210 and the semiconductor apparatus 220 can change the temperature detection circuit while suppressing fluctuation in the electric characteristics.

By using the configuration and arrangement of the semiconductor apparatus 200 of the present invention, it is possible to provide a semiconductor apparatus capable of changing the temperature detection circuit while suppressing fluctuations in the electric characteristics whether the semiconductor apparatus is adapted to the emitter potential type semiconductor apparatus or the independent type semiconductor apparatus.

However, the semiconductor apparatus 210 and the semiconductor apparatus 220 use the first terminal 4d in common as the input/output terminal of the temperature detection circuit, but use different terminals used in combination with the first terminal 4d. While the terminal used in combination with the first terminal 4d is the second terminal 4e for the semiconductor apparatus 210, it is the third terminal 4f for the semiconductor apparatus 220.

The following will describe how the semiconductor apparatus is adapted to a case where the input/output terminals of the temperature detection circuit need to be matched for the semiconductor apparatus 210 and the semiconductor apparatus 220.

Figure 16:
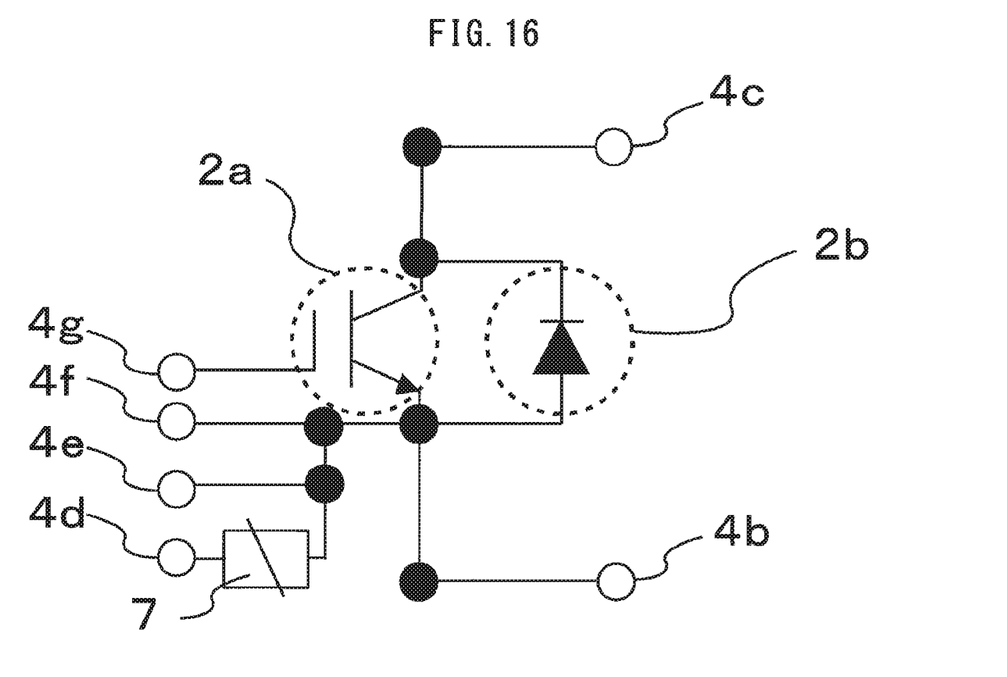
FIG. 16 is a circuit diagram of the emitter potential type semiconductor apparatus according to the second embodiment of the present invention.

Matching the input/output terminals of the temperature detection circuit is possible by effectively using the second terminal 4e of the semiconductor apparatus 220. As can be confirmed from FIG. 14 and FIG. 15, the second terminal 4e is not electrically connected to other conductors and terminals. An electric circuit shown in FIG. 16 can be formed by wire-connecting the second terminal 4e to any one of the other electrode 7c of the temperature detection device 7, the second conductor 6d and the third terminal 4f or a combination thereof. That is, by adding the above-described wiring, the semiconductor apparatus 220 can set the second terminal 4e and the third terminal 4f to the same potential and use the first terminal 4d and the second terminal 4e as the input/output terminals of the temperature detection circuit as in the case of the semiconductor apparatus 210.

As described above, the other electrode 7c of the temperature detection device 7 is positioned at a distance where the other electrode 7c can be wire-connected to both the second terminal 4e and the second conductor 6d, but since the second terminal 4e and the third terminal 4f are used for wiring in the semiconductor apparatus 220, there may be a case where it is difficult to secure a space to allow wire bonding. In such a case, the second terminal 4e and the third terminal 4f are preferably positioned at a distance where they can be wire-connected.

Note that the semiconductor apparatus 200 according to the present second embodiment is configured using the chip-type temperature detection device 7, but the semiconductor apparatus 200 can be configured if the temperature detection device 7 is at least a wire-bondable temperature detection device 7.

Since the fourth conductor of the semiconductor apparatus according to the first embodiment is deleted, the semiconductor apparatus 200 according to the present second embodiment can miniaturize the semiconductor apparatus more than the semiconductor apparatus 100 according to the first embodiment.

Although the switching device 2a and the rectification device 2b made of silicon have been presented in the first and second embodiments, the switching device 2a and the rectification device 2b may also be formed of wide band gap semiconductors with a wider band gap than that of silicon. Examples of wide band gap semiconductors include silicon carbide, nitride gallium-based material or diamond.

The switching device 2a and the rectification device 2b formed of such wide band gap semiconductors exhibit higher withstand voltage and higher maximum allowable current density, which makes it possible to miniaturize the switching device 2a and the rectification device 2b and use of the miniaturized switching device 2a and rectification device 2b makes it possible to miniaturize a semiconductor module incorporated with these devices.

However, since the miniaturization of the whole apparatus narrows the wiring space inside the apparatus, when the type of the temperature detection circuit is changed, there is an increasing possibility that it may be unavoidable to take measures for changing not only wiring of the temperature detection circuit but also a wiring layout involving a main circuit (inverter circuit section). That is, it is more difficult to change the design of the temperature detection circuit while suppressing fluctuation in electric characteristics. The semiconductor apparatus using such a wide band gap semiconductor device can also obtain the effects described in the present first and second embodiments.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-027780, filed on Feb. 20, 2018 including specification, claims, drawings and summary, on which the Convention priority of the present application is based, is incorporated herein by reference in its entirety.

The invention claimed is:

1. A semiconductor apparatus comprising:
an insulating substrate including an insulating layer having a first main surface and a second main surface, a metal plate on the first main surface, and a first conductor, a second conductor, a third conductor and a fourth conductor on the second main surface;

a semiconductor device including a rear electrode electrically connected to the first conductor and a front electrode electrically connected to the second conductor;

a temperature detection device including a first electrode electrically connected to the third conductor, a second electrode electrically connected to the fourth conductor, and comprising a resistor having temperature dependency, and an active region of the resistor is positioned between the first electrode connected to the third conductor and the second electrode connected to the fourth conductor;

a first terminal electrically connected to the third conductor;

a second terminal positioned so as to be wire-connectable to the fourth conductor;

a third terminal electrically connected to the second conductor; and case resin covering the semiconductor device and the temperature detection device, wherein the fourth conductor is positioned so as to be wire-connectable to the second conductor, and each of the first terminal, the second terminal and the third terminal includes a terminal part projecting from the case resin for electric connection with an outside of the semiconductor apparatus and a wire-bonding part for wiring inside the semiconductor apparatus.

2. The semiconductor apparatus according to claim 1, wherein the fourth conductor is electrically connected to the second terminal.

3. The semiconductor apparatus according to claim 1, wherein the fourth conductor is electrically connected to the second conductor.

4. The semiconductor apparatus according to claim 1, wherein the second terminal and the third terminal are positioned so as to be wire-connectable together.

5. The semiconductor apparatus according to claim 1, wherein the semiconductor device is made of a wide-band-gap semiconductor, which has a wider band gap than a band gap of silicon.

6. The semiconductor apparatus according to claim 1, wherein the second electrode outputs a signal including information on a temperature inside the semiconductor apparatus when the second electrode is connected to a temperature measuring instrument.

* * * * *